United States Patent [19]

Asaumi et al.

[11] Patent Number: 4,906,549

[45] Date of Patent: Mar. 6, 1990

[54] POSITIVE-WORKING PHOTORESIST COMPOSITION WITH QUINONE DIAZIDE SULFONIC ACID ESTER AND NOVOLAC MADE FROM M-CRESOL, P-CRESOL AND ALIPHATIC PHENOL WITH 2-6 CARBON ATOMS

[75] Inventors: Shingo Asaumi, Fujisawa; Hidekatsu Kohara, Chigasaki; Hatsuyuki Tanaka, Samukawa; Masanori Miyabe, Fujisawa; Toshimasa Nakayama, Hiratsuka, all of Japan

[73] Assignee: Tokyo Ohka Kogyo Co., Ltd., Kanagawa, Japan

[21] Appl. No.: 182,848

[22] Filed: Apr. 18, 1988

Related U.S. Application Data

[63] Continuation-in-part of Ser. No. 45,602, May 1, 1987, abandoned.

[30] Foreign Application Priority Data

May 2, 1986 [JP] Japan ................................ 61-102617

[51] Int. Cl.4 .......................... G03C 1/60; G03C 1/54; G03C 1/495
[52] U.S. Cl. .................................. 430/192; 430/165; 430/193; 430/326
[58] Field of Search ................ 430/192, 193, 165, 326

[56] References Cited

U.S. PATENT DOCUMENTS

| 3,859,099 | 1/1975 | Petropoulos et al. | 430/190 |
|---|---|---|---|
| 4,123,279 | 10/1978 | Kobayashi | 430/192 |
| 4,173,470 | 11/1979 | Fahrenholtz et al. | 430/192 |
| 4,289,838 | 9/1981 | Rowe et al. | 430/192 |
| 4,299,911 | 11/1981 | Ochi et al. | 430/192 |
| 4,377,631 | 3/1983 | Toukhy et al. | 430/192 |
| 4,499,171 | 2/1985 | Hosaka et al. | 430/192 |
| 4,529,682 | 7/1985 | Toukhy | 430/192 |
| 4,551,409 | 11/1985 | Gulla et al. | 430/192 |
| 4,690,882 | 9/1987 | Taniguchi et al. | 430/192 |
| 4,719,167 | 1/1988 | Miura et al. | 430/192 |
| 4,797,346 | 1/1989 | Yamamoto et al. | 430/192 |

FOREIGN PATENT DOCUMENTS

| 118291 | 9/1984 | European Pat. Off. | 430/192 |
|---|---|---|---|
| 164740 | 8/1985 | Japan | 430/192 |

OTHER PUBLICATIONS

Pampalone, T. R., *Solid State Technology*, 6/1984, pp. 115-120.
English Translation of Japanese Pub. #164,740 (Japan Synthetic Rubber M), published 8/27/85.

*Primary Examiner*—Charles L. Bowers, Jr.
*Attorney, Agent, or Firm*—Wyatt, Gerber, Burke and Badie

[57] ABSTRACT

A positive-working photoresist composition suitable for fine patterning in the manufacturing of semiconductor devices such as VLSIs with high fidelity is proposed. The composition comprises: (A) 100 parts by weight of a phenolic novolac resin prepared by the condensation reaction of a specific ternary mixture of three kinds of phenolic compounds and formaldehyde; and (B) 20-60 parts by weight of a photosensitizer which is preferably an ester of naphthoquinone diazidesulfonic acid and a hydroxylated benzophenone compound. The phenolic mixture is composed of 10-45% by weight of m-cresol, 35-88% by weight of p-cresol and 2-30% by weight of a substituted phenol represented by the general formula $R \cdot C_6H_4 \cdot OH$, in which R is a monovalent aliphatic hydrocarbon group having 2-6 carbon atoms selected from alkyl and alkenyl groups.

5 Claims, 1 Drawing Sheet

POSITIVE-WORKING PHOTORESIST COMPOSITION WITH QUINONE DIAZIDE SULFONIC ACID ESTER AND NOVOLAC MADE FROM M-CRESOL, P-CRESOL AND ALIPHATIC PHENOL WITH 2-6 CARBON ATOMS

This is a continuation-in-part application from a co-pending U.S. patent application Ser. No. 045,602 filed May 1st, 1987, now abandoned.

BACKGROUND OF THE INVENTION

The present invention relates to a positive-working photoresist composition or, more particularly, to a positive-working photoresist composition suitable for use in fine patterning of a photoresist layer in the manufacturing process of semiconductor-based devices such as LSIs, VLSIs and the like.

Recent progress in the semiconductor technology day by day has aroused a rapidly increasing demand for computerized instruments including computers for industrial use, instruments for automatization of offices, personal computers and the like and, corresponding thereto, semiconductor devices such as integrated circuits are under an overwhelming trend toward increase in the density or degree of integration. For example, the times are already entering the era of VLSIs having a density of 1 megabit or higher after passing through the ages of 256 kilobits. Such a high density of integration in VLSIs naturally requires extremely fine patterning on semiconductor wafers in the so-called submicron range. For example, the minimum line width to be reproduced with high fidelity in the photoresist layer is about 2 $\mu$m in semiconductor ICs for 256 kilobits DRAMs, about 1.0 to 1.3 $\mu$m in devices for 1 megabit DRAMs about 0.7 to 0.8 $\mu$m in devices for 4 megabits DRAMs so that the technology of patterning must comply with such an extremely high precision.

As is known, the patterning works on the semiconductor wafers for the manufacture of integrated circuits are performed by the technology of photolithography using a photoresist composition. Of the two types of photoresist compositions including positive-working and negative-working ones, the positive-working photoresist compositions are preferred widely in the works on fine patterning in which high-fidelity reproduction of a line pattern having a width of 1 to 2 $\mu$m is essential.

The principal ingredients in most of the conventional positive-working photoresist compositions are an alkali-soluble novolac resin as the film-forming constituent and a quinone diazide compound as the photodecomposable or photosensitive constituent in the form of a mixture. Typical photosensitizer compounds of the quinone diazide type include sulfonic acid esters formed between a naphthoquinone diazide sulfonic acid and a compound having one or more of phenolic hydroxy groups disclosed in U.S. Pat. No. 3,402,044 and other esters disclosed in U.S. Pat. No. 3,046,118, No. 3,106,465 and No. 3,148,983.

In respect of the film-forming constituent of the photoresist composition which is typically an alkali-soluble novolac resin, on the other hand, various types of novolac resins have been proposed including phenol-formaldehyde novolac resins disclosed in U.S. Pat. No. 3,402,044 and cresol novolac resins disclosed in Electrochemistry and Industrial Physical Chemistry, volume 48, page 584 (1980). Further, Japanese Patent Kokai 59-17112 teaches that the sensitivity of a positive-working photoresist composition comprising a cresol novolac resin as the film-forming constituent can be improved by suitably selecting the proportion of the cresol isomers in the cresol used in the preparation of the cresol novolac resin. Japanese Patent Kokai 60-164740 teaches that the alkali-soluble novolac resin formulated in a positive-working photoresist composition is prepared from a phenolic mixture of a mixed cresol of m- and p-cresols and xylenol and/or a phenolic diphenyl derivative such as 4-phenyl phenol so that the photoresist may be imparted with increased resistance against dry etching. Such a photoresist composition, however, has a problem that scums are found on the resist pattern or, in particular, on the substrate surface obtained by development after pattern-wise exposure to light to decrease the quality of the pattern reproduction.

Turning now to the problems in the process of exposure of the photoresist layer to light, exposure is carried out either by the exposure by direct contacting or by the exposure by minifying projection. In the former method of contacting exposure, the photoresist layer formed on the surface of a semiconductor wafer is exposed to light through a patterned photomask in direct contact with the photoresist layer. This method is advantageous in respect of the contrast of the patterned image so that a patterned photoresist layer of a considerably high contrast can be obtained by this method even when the photoresist composition used there is inherently inferior in respect of the contrast and fidelity of the pattern reproduction. On the contrary to the advantages, this method has some disadvantages and problems. For example, the photomask is sometimes damaged mechanically as a natural consequence of direct contact with the photoresist layer in each time of exposure so that extreme care is required in handling the photomask and good quality of the photomasks can be maintained only with expenses more than negligible. Moreover, needless to say, the pattern on the photomask must be of the full-size relative to the pattern to be reproduced so that a patterned photomask having such a high precision is unavoidably very expensive, especially, when the line width of the pattern is in the submicron range.

In the method of exposure by minifying projection, on the other hand, the dimension of the pattern on a patterned photomask can be as large as 5 to 10 times of that in the photoresist pattern to be reproduced so that even a photomask of high precision for patterning in the submicron range can be obtained with a relatively low cost. On the contrary to this advantage, this method is disadvantageous in respect of the contrast of light between the areas to be exposed and not to be exposed in comparison with the exposure by direct contacting of the photomasks. Therefore, this method of exposure by minifying projection is applicable to the reproduction of a pattern of high precision only when the photoresist composition is inherently highly sensitive in exposure to light with relatively low contrast.

In the manufacture of semiconductor devices such as VLSIs, furthermore, the pattern to be formed in the photoresist layer is not composed of lines having one and the same line width but includes lines having varied line widths combined in a complicated manner. This fact causes a difficult problem affecting the quality of pattern reproduction since the minimum exposure dose by which the photoresist layer on the exposed areas can be removed away by development considerably depends on the line width. Taking the minimum exposure dose to a pattern of 2.0 μm line widths as unity, for example, the minimum exposure doses to patterns of 1.5 μm and 1.0 μm line widths are 1.2 to 1.3 and 1.5 to 1.7, respectively. Therefore, an exposure dose which is optimum for a line of certain line width may be too small or too large for lines having a smaller or larger line width, respectively, in the same pattern to cause insufficient reproduction of finer lines or excessive removal of the photoresist layer of the coarser lines so that the fidelity of pattern reproduction cannot be highest over whole area of the pattern. Moreover, the surface of a semiconductor device under way of processing is not completely flat but usually has a stepwise height difference of 0.5 to 10 μm from portion to portion so that the thickness of a photoresist layer formed on such a stepwise surface cannot be uniform to be smaller in the upside area of the step boundary and larger in the downside area of the step boundary. When such a photoresist layer is exposed to light and developed, therefore, it is usual that the line width of the pattern reproduced in the photoresist layer is smaller in the area where the photoresist layer has smaller thickness than in the area where the thickness is larger affecting the fidelity of pattern reproduction.

In connection with the process of etching on the surface of a semiconductor wafer on which a patterned photoresist layer of submicron fineness is formed, an undesirable phenomenon of side etching is unavoidable more or less in a wet process so that the process of etching is sometimes performed by a dry process free from side etching by use of plasma. In this dry etching method, however, the patterned photoresist layer as the etching mask is attacked by the plasma to cause gradual reduction in the film thickness. Accordingly, it is a desirable condition that the patterned line of the photoresist layer has a cross section in which the width of the line is not affected even when the film thickness is reduced by the attack of the plasma in the process of dry etching.

The above described problems each concern the poor reproducibility or fidelity between the original of the pattern on the photomask and the patterned image reproduced in the photoresist layer. The reasons therefor include, as is mentioned above, the decrease in the contrast in the exposure by minifying projection between the exposed and unexposed areas, difference in the optimum exposure doses between line patterns having different line widths, difference in the film thickness of the photoresist layer between the areas on both sides of a step boundary on the wafer surface having stepwise height differences, and so on.

These problems can be solved as a whole only by the use of a photoresist composition having high fidelity in pattern reproduction and free from the influence of the exposure dose on the dimensions of the reproduced pattern. The photoresist composition free from the influence of the exposure dose on the dimensions of the reproduced pattern here implied should have following characteristics. Namely, the reproduced line pattern should have a line width which is an accurate reproduction of the line in the original pattern on the photomask without expansion or diminishment irrespective of the exposure dose or the extent of development. The patterned line of the photoresist layer should have a rectangular cross section standing on the substrate surface with definitely angled shoulders while undesirable cross sectional configurations include those having trailing skirts on the substrate surface even with definitely angled shoulders because the photoresist layer may disappear in the thin skirt portions by the attack of the etching plasma to cause a change in the line width of the photoresist pattern.

SUMMARY OF THE INVENTION

An object of the present invention is therefore to provide a positive-working photoresist composition free from the above described problems capable of giving a patterned photoresist layer which is an accurate reproduction of the original pattern with high fidelity and unaffected by the influence of the exposure dose on the width of the patterned lines.

Thus, the positive-working photoresist composition provided by the invention comprises, in admixture:

(A) 100 parts by weight of a phenolic novolac resin which is a condensation product of a phenolic mixture and formaldehyde; and (B) from 20 to 60 parts by weight of a photosensitizer mainly composed of an ester of naphthoquinone diazidesulfonic acid, the phenolic mixture being composed of (a) from 10 to 45% by weight or, preferably, from 20 to 40% by weight of a first phenolic compound which is m-recol, (b) from 35 to 88% by weight or, preferably from 40 to 60% by weight of a second phenolic compound which is p-cresol, and (c) from 2 to 30% by weight or, preferably, from 10 to 25% by weight of a third phenolic compound which is a substituted phenol represented by the general formula

$$R.C_6H_4.OH, \qquad (I)$$

in which R is a monovalent aliphatic hydrocarbon group having 2 to 6 carbon atoms selected from the class consisting of alkyl groups and alkenyl groups an $C_6H_4$ is a phenylene group.

DETAILED DESCRIPTION OF THE PREFERRED EMBODIMENTS

Figure 1:
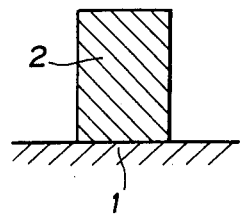
FIGS. 1, 2 and 3 each schematically illustrate a cross section of a patterned line of the photoresist layer produced in Examples.

As is understood from the above given summarizing description of the invention, the most characteristic feature of the inventive positive-working photoresist composition consists in the use of a specific phenolic novolac resin as the film-forming constituent which is a condensation product of a ternary mixture of specific phenolic compounds and formaldehyde. The ternary mixture of the phenolic compounds should essentially be composed of (a) from 10 to 45% by weight or, preferably, from 20 to 40% by weight of a first phenolic compound which is m-cresol, (b) from 35 to 88% by weight or, preferably, from 40 to 60% by weight of a second phenolic compound which is p-cresol, and (c) from 2 to 30% by weight or, preferably, from 10 to 25% by weight of a third phenolic compound which is a substituted phenol represented by the general formula (I) given above, in which each of the symbols has the meaning defined above. When the phenolic novolac resin as the film-forming constituent in the inventive photoresist composition is prepared b the condensation reaction of formaldehyde with a phenolic mixture of which the mixing ratio of the three kinds of the phenolic compounds is outside the above mentioned range, the performance of the photoresist composition obtained by compounding the resin would be unsatisfactory in respect of the photosensitivity and/or the cross sectional configuration of the patterned lines of the photoresist layer.

In the general formula (I) representing the substituted phenol as the third phenolic compound, the symbol R denotes a monovalent aliphatic hydrocarbon group having 2 to 6 carbon atoms selected from the class consisting of alkyl groups, e.g., ethyl, isopropyl and tert-butyl groups, and alkenyl groups, e.g., vinyl and allyl groups. Although the group denoted by R can be bonded to the benzene nucleus at any position relative to the hydroxy group, it is preferable that the group denoted by R is bonded to the nucleus at the 2- or 4- position relative to the hydroxy group. Exemplary of suitable substituted phenols as the third phenolic compound are 2- and 4-ethylphenols, 2- and 4-tert-butyl-phenols, 2- and 4-allylphenols, 2- and 4-isopropyl-phenols and the like. These substituted phenols may be used either singly or as a combination of two kinds or more as the third phenolic compound according to need.

The component (A) in the inventive positive-working photoresist composition is a phenolic novolac resin obtained by the condensation reaction of the ternary mixture of the phenolic compounds and formaldehyde. The source material of formaldehyde used in the condensation reaction may be an aqueous solution such as formalin or a polymer such as paraformaldehyde.

The component (B) in the inventive photoresist composition is a photosensitizer mainly composed of an ester of naphthoquinone diazidosulfonic acid. This compound can be easily obtained as a reaction product in the esterification reaction of naphthoquinone diazido-sulfonic acid and a compound having at least one phenolic hydroxy group in a molecule such as polyhydroxy benzophenones, alkyl gallates and the like according to a known procedure.

The above mentioned compound having a phenolic hydroxy group is exemplified by, in addition to the above mentioned alkyl gallates, polyhydroxy benzophenones such as tetrahydroxy benzophenones, trihydroxy benzenes, trihydroxy benzene monoethers, 2,2',4,4'-tetrahydroxy diphenylmethane, 4,4'-dihydroxy diphenylpropane, 4,4'-dihydroxy diphenyl sulfone, 2,2'-dihydroxy-1,1'-dinaphthyl methane, 2-hydroxy fluorene, 2-hydroxy phenanthrene, polyhydroxy anthraquinones, purpurogallin and derivatives thereof, phenyl 2,4,6-trihydroxy benzoate and the like.

The inventive positive-working photoresist composition should comprise from 20 to 60 parts by weight of the above mentioned naphthoquinone diazidosulfonic acid ester as the photosensitizer per 100 parts by weight of the phenolic novolac resin as the film-forming constituent. When the amount of the photosensitizer is in excess of 60 parts by weight, the photoresist composition would have a remarkably decreased sensitivity while, when the amount thereof is too small, an adverse effect is caused on the cross sectional configuration of the line in the patterned photoresist layer.

The inventive positive-working photoresist composition is used usually in the form of a solution prepared by dissolving the above described phenolic novolac resin and the naphthoquinone diazidosulfonic acid ester in a suitable organic solvent. Exemplary of the organic solvent suitable for the purpose are ketones such as acetone, methyl ethyl ketone, cyclohexanone and isoamyl ketone, polyhydric alcohols and derivatives thereof such as ethylene glycol, ethylene glycol monoalkyl ethers and acetates thereof, ethylene glycol monoacetate, monomethyl ethers, monoethyl ethers, monopropyl ethers, monobutyl ethers and monophenyl ethers of diethylene glycol or monoacetate thereof, and the like, cyclic ethers such as dioxane, and ester such as methyl acetate, ethyl acetate and butyl acetate. These organic solvents can be used either singly or as a mixture of two kinds or more according to need.

The inventive positive-working photoresist composition may be admixed optionally with various kinds of known additives having compatibility with the essential ingredients and conventionally used in photoresist compositions such as auxiliary resins, plasticizers, stabilizers, coloring agents to serve for further increasing the visibility of the patterned image after development, and so on.

The procedure for forming a patterned photoresist layer using the inventive photoresist composition may be any of conventional ones. For example, the surface of a substrate body such as a semiconductor silicon wafer is coated with the inventive photoresist composition in the form of an organic solution by use of a suitable coating machine such as spinners followed by drying to form a uniform photoresist layer thereon, which is then exposed pattern-wise to light on a minifying projector or a suitable apparatus for exposure through a photomask bearing a desired pattern followed by development using a developer solution such as an aqueous solution of an organic base, e.g., tetramethyl ammonium hydroxide and choline, in a concentration of 2 to 5% by weight so that the photoresist layer is selectively dissolved away on the areas where the photoresist composition has been imparted with increased solubility in the developer solution as a result of exposure to light to give a high-fidelity minifed reproduction of the pattern on the photomask. Advantageously, the thus reproduced pattern is a very accurate reproduction of the photomask pattern to the utmost fineness having a line width in the submicron range with dimensional accuracy. The dimensional accuracy is not affected even on a substrate surface having stepwise difference in levels in the exposure by minifying projection which may give poor contrast as a trend. Accordingly, the inventive positive-working photoresist composition can be used advantageously in the manufacture of high-precision semiconductor devices such as VLSIs.

In the following, the positive-working photoresist composition of the invention is illustrated in more detail by way of examples and comparative examples.

EXAMPLE 1

A phenolic novolac resin was prepared according to a conventional procedure by the condensation reaction in a reaction mixture of a ternary mixture of phenolic compounds composed of 40% by weight of m-cresol, 50% by weight of p-cresol and 10% by weight of 2-ethylphenol with admixture of formalin in the presence of oxalic acid as the catalyst. A positive-working photoresist composition in the form of a solution was prepared by dissolving 100 parts by weight of the above prepared phenolic novolac resin and 30 parts by weight of 2,3,4-trihydroxy benzophenone ester of naphthoquinone-1,2-diazidosulfonic acid in 390 parts by weight of ethyleneglycol monoethyl ether acetate followed by filtration through a membrane filter having pores of 0.2 µm diameter.

A silicon wafer of 4-inch diameter was uniformly coated with the thus prepared photoresist solution in a coating thickness of 1.3 μm as dried using a resist coater (Model TR-4000, manufactured by Tazmo Co.) followed by drying and prebaking for 90 seconds on a hot plate kept at 110° C. to give a photoresist layer on the wafer. The silicon wafer provided with the photoresist coating layer was then exposed to ultraviolet light on a minifying projector (Wafer Stepper Model DSW-4800, manufactured by GCA Co.) through a test chart photomask (manufactured by Dai-Nippon Printing Co.) and developed for 30 seconds at 23° C. using a 2.38% by weight aqueous solution of tetramethyl ammonium hydroxide as the developer solution.

The shortest exposure time was 1000 milliseconds for completely removing the line pattern of 1.0 μm width on the exposed area. The patterned lines of the photoresist layer thus obtained had an ideally rectangular cross section as is schematically illustrated in FIG. 1 of the accompanying drawing showing the line 2 with perpendicularly upright side surfaces standing on the substrate 1. The thus prepared photoresist pattern on the substrate surface was absolutely free from scums as was shown by the microscopic examination.

EXAMPLES 2 TO 4 AND COMPARATIVE EXAMPLES 1 TO 5.

The phenolic novolac resins used in Examples 2 to 4 were prepared each in the same manner as in Example 1 except that the third phenolic compounds combined with m-cresol and p-cresol in the phenolic mixture for the condensation reaction with formaldehyde were 4-tert-butylphenol, 2-allylphenol and 4-isopropylphenol, respectively, and the mixing ratio of m- and p-cresols and the third phenolic compound was as indicated in the Table given below. The novolac resins used in Comparative Examples 1 to 4 were prepared each from a phenolic mixture composed of m- and p-cresols alone in a mixing ratio indicated in the table with omission of the third phenolic compound. The novolac resin used in Comparative Example 5 was prepared from a phenolic mixture composed of m-cresol, p-cresol and 4-phenyl phenol as the third phenolic compound in the weight proportion shown in the table.

Photoresist compositions were prepared in these examples and comparative examples each by dissolving 100 parts by weight of the phenolic novolac resin and a photosensitizer I, II, III or IV shown below in an amount indicated in the table in 390 parts by weight of ethylene glycol monoethyl ether acetate as the solvent.

Figure 2:
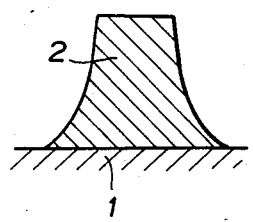
Figure 3:
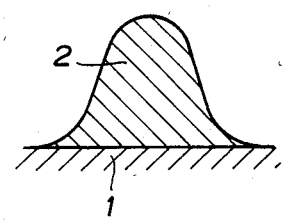

Photosensitizer I: esterification product of 1.0 mole of 2,3,4-trihydroxy benzophenone and 1.6 moles of naphthoquinone-1,2-diazide-5-sulfonyl chloride Photosensitizer II: esterification product of 1.0 mole of 2,4,6-trihydroxy benzophenone and 1.8 moles of naphthoquinone-1,2-diazide-5-sulfonyl chloride Photosensitizer III: esterification product of 1.0 mole of 2,3,4-trihydroxy benzophenone and 2.0 moles of naphthoquinone-1,2-diazide-5-sulfonyl chloride Photosensitizer IV: esterification product of 1.0 mole of 2,3,4,4'-tetrahydroxy benzophenone and 2.2 moles of naphthoquinone-1,2-diazide-5-sulfonyl chloride Each of the photoresist compositions was subjected to the test of the photosensitivity, i.e. the shortest exposure time at which an accurate reproduction of a line-and-space pattern of 1 μm line width could be obtained, to give the results shown in the table in milliseconds. The table also shows the cross sectional configuration of the patterned lines by the symbols a, b and c corresponding to the cross sectional configurations of the patterned lines on the substrate illustrated in FIGS. 1, 2 and 3, respectively, as well as the results of the microscopic examination for the scums adhering to the substrate surface.

TABLE

| | | Mixing ratio, % by weight | | | Photosensitizer (parts by weight) | Photosensitivity milliseconds | Cross section | Scum |
|---|---|---|---|---|---|---|---|---|
| | | m-Cresol | p-Cresol | Third phenolic compound | | | | |
| Example | 2 | 30 | 50 | 20 | I (25) | 1250 | a | No |
| | 3 | 40 | 50 | 10 | IV (30) | 800 | a | No |
| | 4 | 45 | 50 | 5 | I (50) | 1500 | a | No |
| Comparative Example | 1 | 60 | 40 | 0 | I (30) | 370 | c | No |
| | 2 | 50 | 50 | 0 | I (30) | 390 | b | No |
| | 3 | 47 | 53 | 0 | I (30) | 450 | b | No |
| | 4 | 60 | 40 | 0 | III (30) | 450 | c | No |
| | 5 | 10 | 87 | 3 | II (25) | 1500 | a | Yes |

EXAMPLE 5

The experimental procedure was substantially the same as in Example 1 except that the test chart photomask was replaced with a test chart reticle having line-and-space patterns of 1.25 μm and 2.0 μwidths. The results were that the pattern of the photoresist layer produced on the silicon wafer was an accurate reproduction of the pattern on the test chart reticle with high fidelity.

COMPARATIVE EXAMPLE 6

The experimental procedure was substatially the same as in Comparative Example 1 except that the test chart photomask was replaced with the same test chart reticle as used in Example 5 and the length of the exposure time was 450 milliseconds. The results were that the line-and-space pattern of 1.25 μm line width could be reproduced on the silicon wafer while the line-and-space pattern of 2.0 μm line width was reproduced only incompletely as composed of a line pattern of 1.6 μm width and a space pattern of 2.4 μm width.

What is claimed is:

1. A positive-working photoresist composition which comprises, in admixture:
   (A) 100 parts by weight of a phenolic novolac resin which is a condensation product of a phenolic mixture and formaldehyde; and
   (B) from 20 to 60 parts by weight of a photosensitizer mainly composed of an ester of naphthoquinone diazidesulfonic acid, the phenolic mixture being composed of (a) from 10 to 45% by weight of a first phenolic compound which is m-cresol, (b) from 35 to 88% by weight of a second phenolic compound which is p-cresol, and (c) from 2 to 30% by weight of a third phenolic compound which is a substituted phenol represented by the general formula

R.C₆H₄.OH, in which R is a monovalent aliphatic hydrocarbon group having 2 to 6 carbon atoms selected from the class consisting of alkyl groups and alkenyl groups and C₆H₄ is a phenylene group.

2. The positive-working photoresist composition as claimed in claim 1 wherein the phenolic mixture is composed of from 20 to 40% by weight of the first phenolic compound, from 40 to 60% by weight of the second phenolic compound and from 10 to 25% by weight of the third phenolic compound.

3. The positive-working photoresist composition as claimed in claim 1 wherein the third phenolic compound is selected from the class consisting of 2- and 4-ethylphenols, 2- and 4-tert-butylphenols, 2- and 4-allylphenols and 2- and 4-isopropylphenols.

4. The positive-working photoresist composition as claimed in claim 1 wherein the ester of naphthoquinone diazidesulfonic acid is an ester of naphthoquinone diazidesulfonic acid with a compound having at least one phenolic hydroxy group in a molecule.

5. The positive-working photoresist composition as claimed in claim 4 wherein the compound having at least one phenolic hydroxy group in a molecule is selected from the class consisting of alkyl gallates, polyhydroxy benzophenones, trihydroxy benzenes, trihydroxy benzene monoethers, 2,2',4,4'-tetrahydroxy diphenyl methane, 4,4'-dihydroxy diphenyl propane, 4,4'-dihydroxy diphenyl sulfone, 2,2'-dihydroxy-1,1'-dinaphthyl methane, 2-hydroxy fluorene, 2-hydroxy phenanthrene, polyhydroxy anthraquinones, purpurogallin and phenyl 2,4,6-trihydroxy benzoate.

* * * * *